United States Patent [19]

Goldman

[11] Patent Number: 4,678,970
[45] Date of Patent: Jul. 7, 1987

[54] POWER AS REQUIRED BEAM DEFLECTION SYSTEM FOR CRT DISPLAYS WITH RASTER SUPPLY SWITCHING

[75] Inventor: Winston W. Goldman, Scottsdale, Ariz.

[73] Assignee: Sperry Corporation, New York, N.Y.

[21] Appl. No.: 858,149

[22] Filed: May 1, 1986

[51] Int. Cl.⁴ .................. H01J 29/70; H01J 29/76
[52] U.S. Cl. ..................................... 315/397; 315/403
[58] Field of Search ................ 315/397, 403, 395

[56] References Cited

U.S. PATENT DOCUMENTS

| | | | |
|---|---|---|---|
| 4,164,688 | 8/1979 | Cushing | 315/397 |
| 4,262,235 | 4/1981 | Neves et al. | 315/397 |

Primary Examiner—Theodore M. Blum
Attorney, Agent, or Firm—Howard P. Terry; Arnold L. Albin

[57] ABSTRACT

An electron beam magnetic deflection system capable of raster and stroke deflection and providing minimum power dissipation in raster mode. Automatic switching of the voltage demanded in raster mode is obtained by continuously sampling the yoke current, the power supply voltage being switched in magnitude and polarity corresponding to the direction of change and polarity of the yoke current. By returning energy stored in the yoke to the power supply during portions of the raster cycle, power efficiency is substantially enhanced.

9 Claims, 11 Drawing Figures

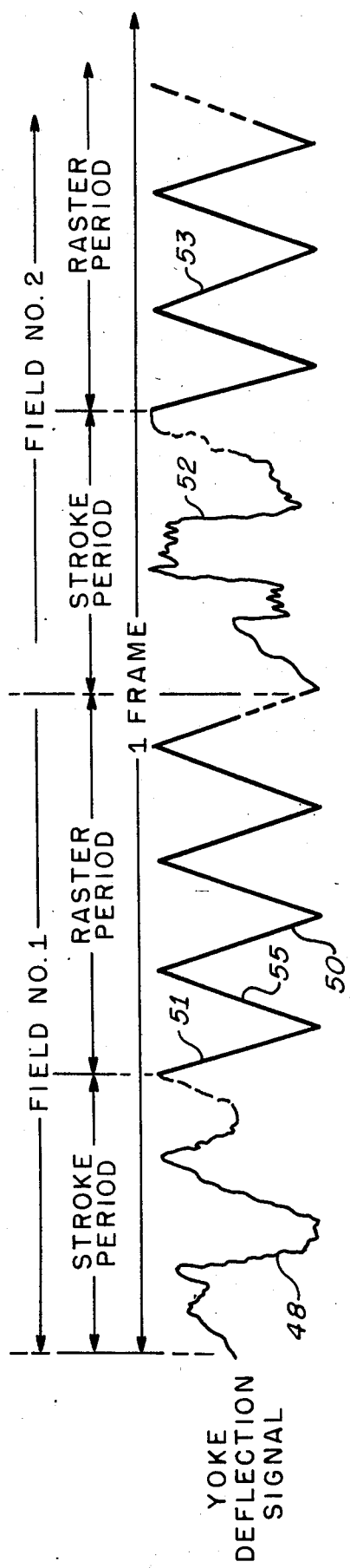
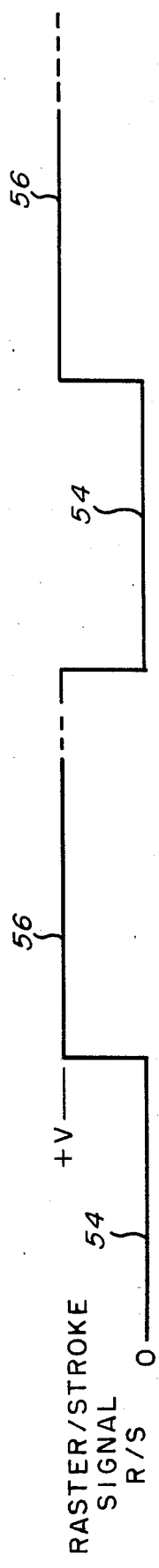
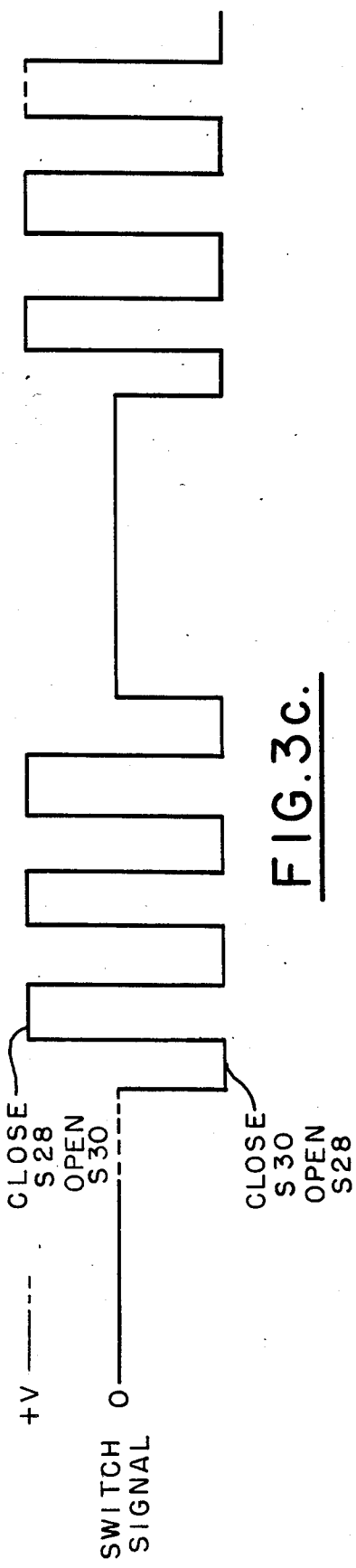
FIG. 3a.
FIG. 3b.
FIG. 3c.

POWER AS REQUIRED BEAM DEFLECTION SYSTEM FOR CRT DISPLAYS WITH RASTER SUPPLY SWITCHING

BACKGROUND OF THE INVENTION

1. Field of the Invention

The invention relates generally to cathode ray beam deflection systems and more particularly to display systems with electromagnetically deflected cathode ray tube random stroke and periodic raster displays. More particularly, the invention relates to systems of the type including dual mode deflection amplifiers providing increased deflection voltage for reducing slewing time in a stroke mode and for reducing power consumption during a raster mode.

2. Description of the Prior Art

The power efficiency of deflection systems that display both raster and stroke writing is relatively low due to the high yoke driving voltages required to assure adequate writing speed. There is a significant increase in power consumption as sophisticated airborne navigation displays require increased display area and more displayed information. Since the deflection yoke driver consumes a significant portion of the total display power, it is desirable to enhance the power efficiency of the deflection system.

A primary requirement for deflection amplifiers for an electromagnetically deflected CRT is that of supplying accurately controlled currents to the deflection yokes to assure linear operation and to provide minimum power dissipation. A CRT deflection yoke is an inductor, hence the supply voltage required is determined by the desired deflection driver output voltage, $L\, di/dt + iR$. Since the rate of deflection for the raster display is generally much higher than for stroke deflection, the supply voltages for raster deflection are correspondingly higher. Further the greater the amount of information to be presented by the display during the stroke period, the higher the slew rate required and the greater the peak power required. Power reduction in the prior art was limited to switching the yoke driver supplied voltages to a lower level during the stroked deflection period than during the raster deflection period, and the use of a flyback raster during the retrace. Apparatus providing suitable circuitry for this purpose is shown in U.S. Pat. No. 3,965,390, issued June 22, 1976 to James M. Spencer, Jr., and assigned to the assignee of the present invention.

With a flyback raster, a period of time is required for flyback and beam settling for each raster line. This time may be as much as ten percent of the total raster time. The power required for flyback is essentially wasted power. Further, higher supply voltages are required to reduce the flyback time, resulting in increased power consumption. By utilizing a bi-directional raster (i.e., writing alternate lines of raster in opposite directions), additional information may be displayed during the retrace period without increasing the supply voltages.

The present invention describes a system for reducing power during the raster display as well as during the stroke display. The invention differs from the prior art by switching the power supplied to the yoke driver during the raster deflection period to the minimum power level required by the deflection waveform, as well as switching supply levels between the raster and stroke deflection periods. The prior art invention of Spencer cited above switches power supplies during the stroke period, but does not augment efficiency during the raster deflection. The present invention is useful in both flyback raster systems and bi-directional raster systems.

SUMMARY OF THE INVENTION

An electron beam magnetic deflection system of the present invention for a cathode ray tube provides linear deflection in a stroke mode and a raster mode, the stroke mode permitting random deflection of the beam and the raster mode providing periodic deflection of the beam. The system comprises a preamplifier input stage responsive to a deflection signal, an output stage coupled to the output of the preamplifier for driving a deflection yoke and providing a current in the deflection coil proportional to the deflection signal, thereby deflecting the electron beam in a direction corresponding to the waveform of the deflection signal, and a switch control coupled to receive raster/stroke mode signals and further coupled to a plurality of switches for energizing the driver stage from voltage sources of opposing polarities and predetermined magnitudes. In stroke mode, voltages of relatively low magnitude and opposing polarities are applied through corresponding switches to energize the driver stage. In raster mode, voltages of predetermined magnitudes greater than the stroke voltages are applied to energize the driver stage, voltages of positive and negative polarities being alternately and sequentially applied to the driver stage to provide outputs corresponding to the desired magnitude and predetermined direction of deflection of the electron beam. The switch control alternately and sequentially energizes pairs of switches corresponding to the desired voltages to be applied in the stroke or raster operating mode in accordance with the raster/stroke control signal and the desired direction of deflection of the electron beam.

BRIEF DESCRIPTION OF THE DRAWINGS

FIG. 3a, 3b, and 3c are graphical representations of control signals and deflection signals during the stroke and raster scan periods of the present invention.

DESCRIPTION OF THE PREFERRED EMBODIMENT

Figure 1:
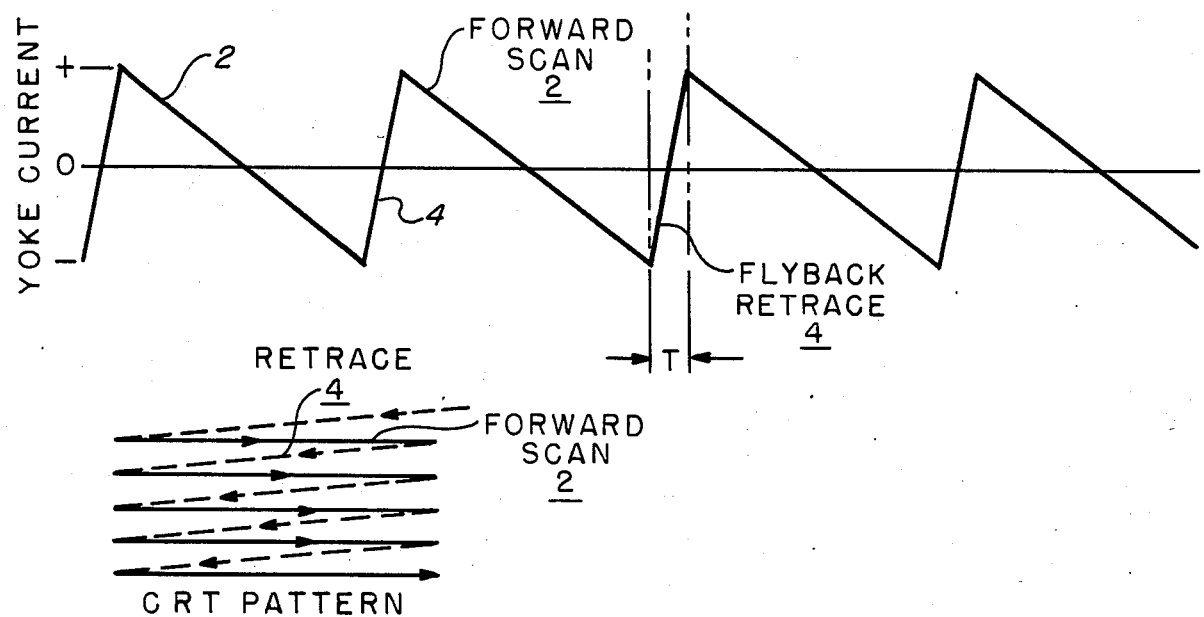
FIG. 1 is a graphical representation showing the yoke current waveform of a flyback deflection system and resulting raster trace on the CRT screen.

As shown in FIG. 1, a conventional unidirectional raster deflection signal is comprised of a sawtooth waveform for energizing a deflection yoke, having a portion 2 during which yoke current linearly decreases from positive to negative values and a second portion 4 during which the yoke current is abruptly increased from the negative peak to a positive peak. As shown in the CRT pattern, a relatively long period of time corresponds to the forward deflection of the electron beam, and a relatively short period of time corresponds to the flyback signal, during which time the electron beam is caused to retrace its path to the opposing side of the CRT screen, whereupon it resumes its forward scan. The beam is normally blanked during the retrace period. Since no useful data is provided during the retrace period, which can amount to as much as ten percent or more of the total raster time, the retrace portion of the scan is unavailable for data presentation and results in additional power losses.

Figure 2:
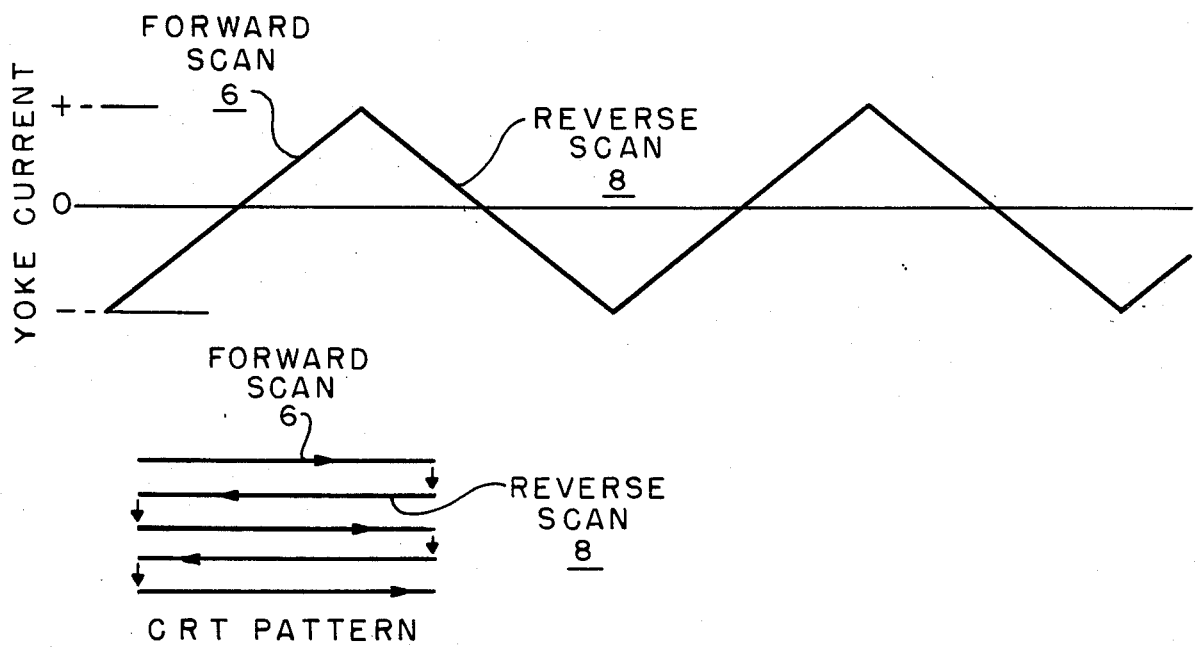
FIG. 2 is a graphical representation of the deflection yoke current waveform and corresponding raster trace on the CRT screen for a bi-directional raster scan.

FIG. 2 shows a bi-directional raster system, in which data is written on alternate lines of the raster as it is deflected in opposing directions. Thus, the yoke current is seen to be in the form of a triangular waveform having substantially equal time periods for forward scan 6 and reverse scan 8. During the forward scan, yoke current is driven from positive to negative polarity, and during the reverse scan the yoke current is driven from negative to positive polarity. The above examples are illustrative only, and can be adapted for driving the electron beam in any desired direction, including vertical or horizontal raster patterns. It is seen from the CRT pattern of FIG. 2 that the forward scan and reverse scan occupy equal intervals of time and that only a small, essentially minimal period of time is required for deflecting the electron beam at the end of the scan interval to the position required for scanning the next line. Consequently, only minimal power is lost during the blanked portion of the scan and both forward and reverse deflections can be used for presentation of data.

Referring now to FIG. 3A, it may be seen that a display frame consists of two sequential and interlaced fields, field number one and field number two which preferably may be repeated at an 80 Hz rate. Each field is divided into a stroke period, during which the deflection signal is aperiodic as noted by waveform segment 48 and a raster period comprised of 256 lines during which the deflection signal is repetitive as noted by waveform 50. The dashed portions of the waveform represent discontinuities, since only portions of the respective waveforms have been presented for clarity. Following completion of the raster period in field number one, field number two is executed, which is comprised of a stroke period 52 and a raster period 53 as in field number one. The sequential display of fields number one and number two constitutes a frame, which is then repeated. Waveform 52 denoting the stroke signal in field number 2 may differ from waveform 48 in that the desired display symbology may change from field to field. While the yoke deflection signal is periodic during the raster scan, it is aperiodic in nature during the stroke duration because of the random nature of the commanded deflection of the CRT beam.

Figure 4:
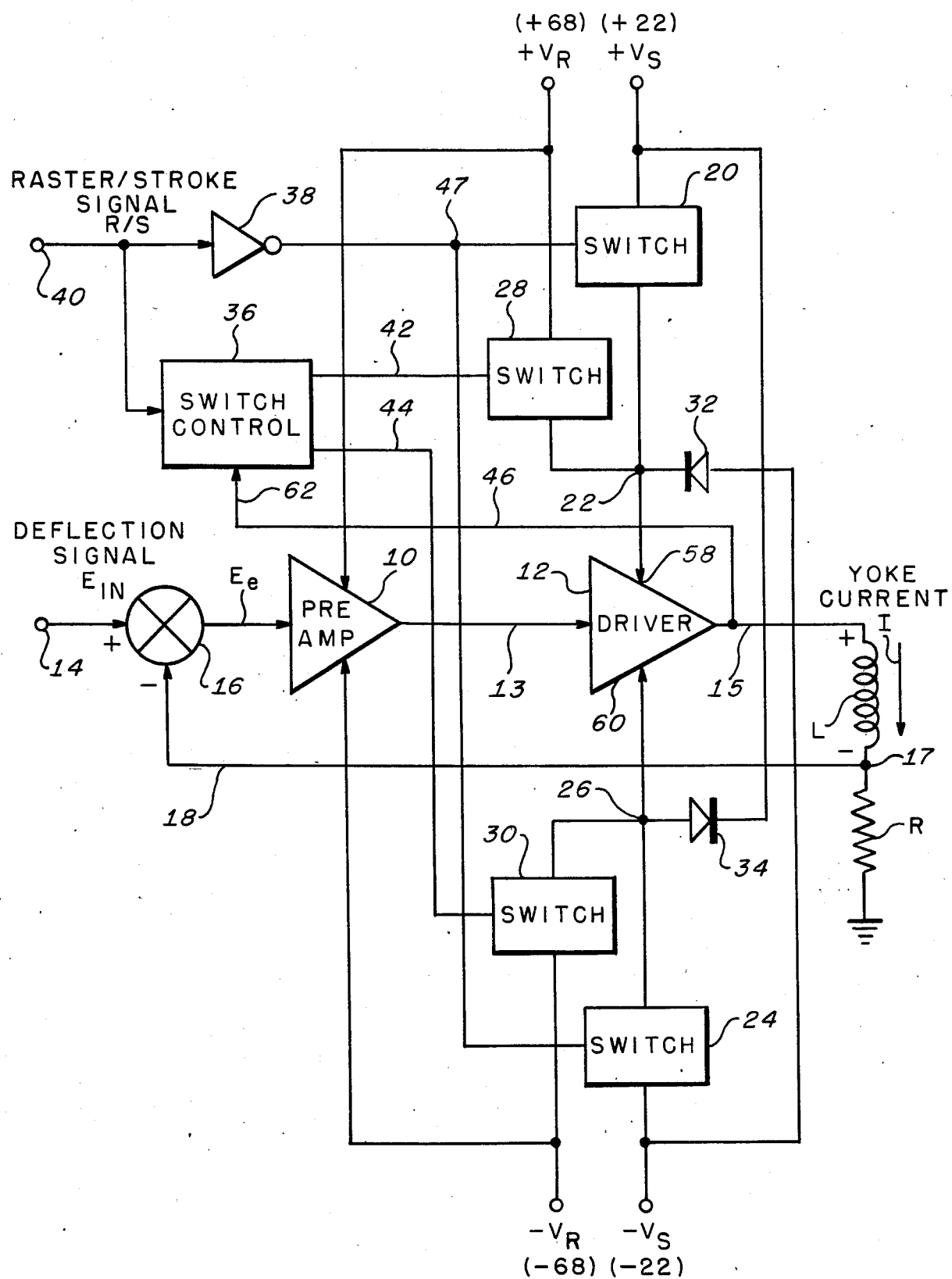
FIG. 4 is a block diagram of an electromagnetic deflection driver system according to the present invention.

In accordance with the present invention, as shown in FIG. 4, a raster power-as-required beam deflection system includes an input stage deflection preamplifier 10, a push-pull output driver stage 12, a deflection yoke L mounted on the cathode ray tube (not shown), and a yoke current sampling resistor R. As noted above, the slew rate required during the stroke mode is generally significantly less than the rate required during the raster mode. This permits a lower voltage source to be applied to driver 12 with consequent power savings during the stroke mode. Further savings are achieved in the present invention by also switching voltages applied to driver 12 in the raster mode, in accordance with the direction of beam deflection. Such switching is accomplished in synchronism with the deflection waveform in a manner to be described below.

An input signal $E_{IN}$ representative of the desired beam deflection is applied at terminal 14 to conventional summing junction 16. The output signal thereof is amplified by the deflection preamplifier 10 which provides an amplified signal to the driver stage 12. The driver stage 12 is preferably of the push-pull type and operates in a conventional manner, having an output coupled to the a deflection yoke L. Preamplifier 10 and driver 12 are operated in a linear mode, so that current applied to yoke L is representative of the deflection signal $E_{IN}$. To assure linearity, a portion of the yoke current flowing through series resistor R is used to provide a feedback voltage $E_e$ on line 18 to summing junction 16. The voltages applied to junction 16 are of opposing polarities, so that any departure from linearity in the output signal of yoke L is applied in such a direction as to linearize the resultant driving signal.

The deflection amplifier of FIG. 4 has the capability of operating in raster mode or stroke-writing mode. In raster mode, the writing speeds required are typically several times greater than that required in stroke-writing mode. This requires a greater rate of change of current to be developed through the yoke L, and thus requires a higher voltage supply.

In stroke mode a positive voltage $+V_S$ is applied to a switch 20 and thence from node 22 to energize driver 12. A corresponding voltage $-V_S$ of opposing polarity is applied to switch 24 and thence through node 26 to driver 12. These supplied are typically ±22 VDC.

In raster mode, switch 28 couples a voltage of positive polarity from voltage source $V_R$ to node 22 from where it is applied to driver 12. Switch 30 applies a negative voltage of magnitude $-V_R$ to node 26 and thereupon to driver 12. These supplies are typically ±68 VDC.

A unidirectional conducting element, such as a diode 32, has a cathode coupled to node 22 and an anode coupled to voltage source $-V_S$. Similarly, diode 34 has its anode coupled to node 26 and the cathode coupled to voltage source $+V_S$. Diodes 32 and 34 are used to couple voltage sources $-V_S$ and $+V_S$, respectively, to driver 12, in a manner to be described, during the raster mode.

Switch control 36 and inverter 38 are energized by signal R/S applied to terminal 40 so as to sequentially and alternately energize pairs of switches 28 and 30 in raster mode and switches 20 and 24 in stroke mode. Switch control 36 also receives a signal, whose function is to be described, on line 46 from the output of driver 12. Inverter 38 receives its input from the signal at terminal 40 and controls switches 20 and 24.

Switches 20, 24, 28, and 30 may be comprised of conventional semiconductor elements biased to operate in either the saturated or cutoff modes, as in said U.S. Pat. No. 3,965,390. Switch control 36 may be comprised of conventional logic gates.

In operation an input signal $E_{IN}$ representative of the desired beam deflection waveform is applied at terminal 14. This signal is amplified signal to the output driver 12 via line 13. Preamplifier 10 is supplied with voltage sources $+V_R$ and $-V_R$ in a conventional manner. The output of driver 12 is connected by line 15 to the yoke L with a positive current I indicated by the direction of the arrow in FIG. 4. The yoke current I also passes through resistor R connected at junction 17. The voltage drop across resistor R is fed back in closed-loop fashion to summing junction 16 where it is algebraically subtracted from the input signal $E_{IN}$ to provide an error signal $E_E$ to preamplifier 10. The closed loop assures that the current in yoke L is a linear representation of the deflection signal applied to input 14 in a conventional manner.

Referring now to FIG. 3B, with continued reference to FIG. 4, a raster/stroke mode control signal R/S applied to input terminal 40 is comprised of a rectangular waveform. During the stroke period 54, the signal R/S is seen to be a logic low. During the raster period 56 the signal is seen to be a logic high. This signal is coupled on line 37 to inverter 38 so that a logic high, denoting a raster command at input 40, results in a logic low at node 47 and switches 20 and 24, coupled to the inverter at node 47, are not enabled. However, during the raster mode, the signal at input 40 is also applied to switch control 36, which thereby enables the energization of switches 28 and 30 upon the satisfaction of a required input signal on line 46 from the output of driver 12. In consequence, only one pair of switches, providing positive and negatively polarized voltage sources, is applied at one time, commensurate with the scan mode of operation.

As shown in FIG. 3c, during the raster period a periodic switch signal (derived from driver 12) is applied on line 46 in synchronism with the raster scan. The function of the switch signal is to control the application of power sources of varying amplitude and polarity to the deflection amplifier for obtaining increased slew speed and power efficiency.

Figure 5A:
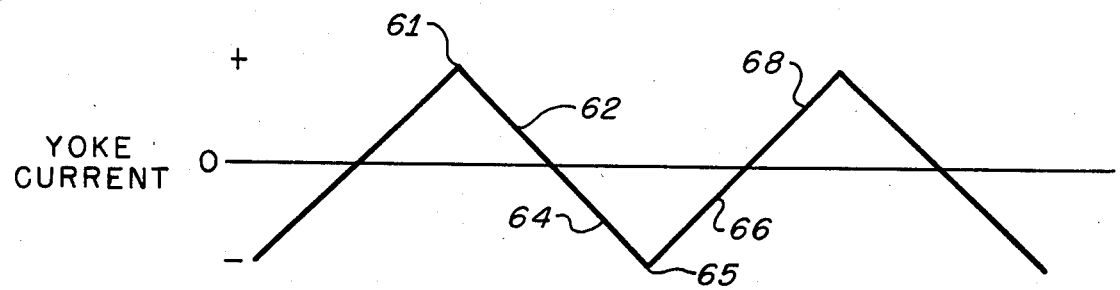
FIGS. 5a–5e are graphical representations showing waveforms at various points of the system of FIG. 4.

Referring now to FIG. 5A, there is shown the yoke current waveform required for bi-directional raster deflection. When the raster is to be deflected in a first predetermined direction, the yoke current ascends in a positive direction 60 and when the raster is to be deflected in a second predetermined direction, as to return substantially to its initial position, the yoke current has a negative or descending slope 64. The voltage required to provide the desired yoke current is determined by the well known formula $$V = L\, di/dt + IR \quad (1)$$

where
L = inductance of the yoke.
I = current through the yoke.
R = Resistance of the yoke.

Figure 5B:
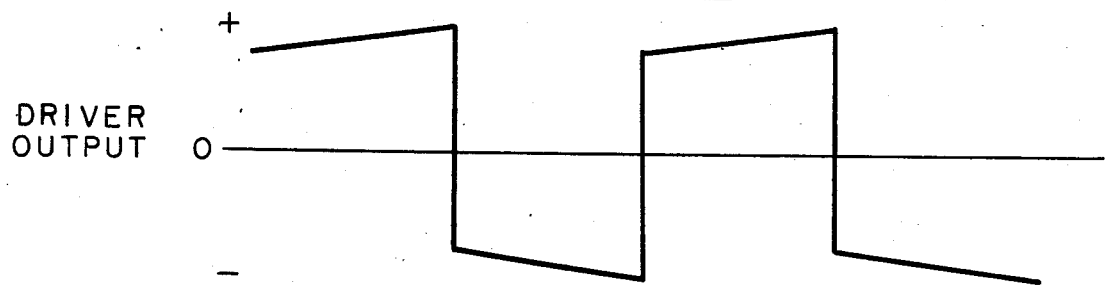

Since di/dt for this current waveform changes from positive to negative for a bidirectional raster, the voltage output of yoke driver 12 must also change correspondingly from positive to negative. The required driver output voltage is shown in FIG. 5B. When the slope of the yoke current 60 is positive, a positive driver output voltage is required. When the slope of the yoke current 64 is negative, a negative driver output voltage is required. Thus, corresponding voltages may be applied to the yoke driver 12 without adversely effecting yoke driver operation, while providing economy in power consumption. The driver output voltage is used to actuate switch control 36 to change the voltages applied during raster operation.

Referring again to FIG. 3b, with continued reference to FIG. 4 and 5a, the stroke period is initiated by the raster/stroke signal R/S during the negative-going pulse 54. Switch 20 is enabled by inverter 38 thereby coupling power supply $+V_S$ to node 22 and to driver 12 at terminal 58. Simultaneously, switch 24 is also enabled by inverter 38 and voltage source $-V_S$ is coupled through switch 24 to node 26 and terminal 60 of driver 12. Since driver 12 is typically a push-pull amplifier, the voltages at points 58 and 60 would typically be applied to the collectors of NPN and PNP transistors, as in the emitter-follower amplifier 10 of said U.S. Pat. No. 3,965,390. In the stroke mode, since the input to switch control 36 is a logic low, switches 28 and 30 are inactive, and therefore voltage sources $+V_R$ and $-V_R$ are inhibited from being applied to driver 12. At the same time, diodes 32 and 34 are back biased by voltage sources $-V_S$ and $+V_S$, respectively, so that the only voltages applied to driver 12 are those heretofore described.

In the raster mode, signal R/S applies a logic high 56 to inverter 38 and switches 20 and 24 are thereby deactivated, removing voltage sources $+V_S$ and $-V_S$ from application to driver 12. Signal R/S is also applied to switch control 36, closing switches 28 and 30 sequentially and alternately as triggered by the driver output signal on line 46. This operation may be more clearly understood by the following analysis of the current flow through the yoke.

Consider now the waveform at segment 62 of FIG. 5a, denoting yoke current flowing in a positive direction (down to ground) and decreasing in amplitude. At the positive peak of the yoke triangular waveform, denoted by point 61, switch 30 is turned on by switch control 36 when triggered by the drive voltage on line 46 at the transition from an increasing yoke current to a decreasing yoke current. Simultaneously, switch 28 is turned off. FIG. 3C shows the condition of switches 28 and 30 corresponding to the raster/stroke signal FIG. 3b and yoke deflection signal of FIG. 3a. Thus, it may be seen that during the negative slope 51 of the raster, switch 30 is closed while switch 28 is open. Power supply $-V_R$ is applied through switch 30 and node 26 to terminal 60 of driver 12. Diode 34 is back biased by $-68$ V applied to the anode from supply $-V_R$ and by $+22$ V applied to the cathode by power supply $+V_S$. Since current through the yoke is flowing in a positive direction, although decreasing in amplitude, it must flow from push-pull driver 12 to ground through yoke L. Diode 32 is forward biased. Thus, the current path is from $-V_S$ through diode 32 to terminal 58 and from the driver output on line 15 through yoke L and resistor R to ground. Since switches 20 and 24 are turned off by the signal from inverter 38, no current flows from supply $+V_S$ to terminal 58, nor from supply $-V_S$ to terminal 60 of driver 12.

Referring now to segment 64 of waveform 5a, where the yoke current is increasing in a negative direction, the flow of current through yoke L is reversed. Since switch 30 is on and switch 28 is off, the current must flow upwards from ground through yoke L along line 15 to driver 12 out lower terminal 60 to power supply $-V_R$. Diode 34 remains back biased while no current flows through diode 32, since no current flows through the upper section of the driver 12.

Figure 5C:
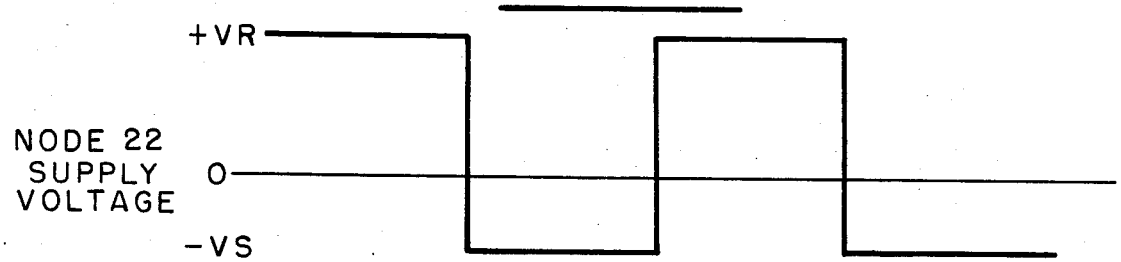
Figure 5D:
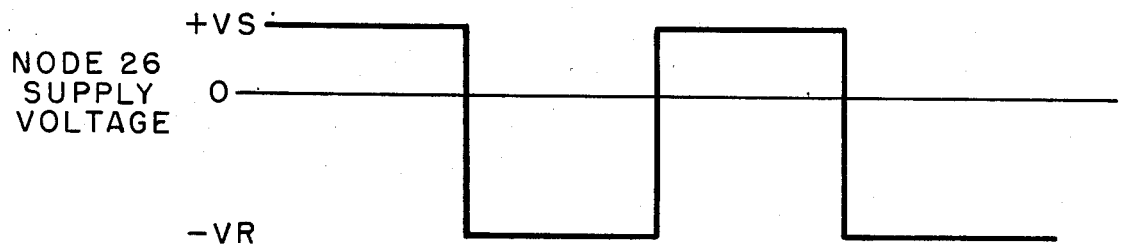

When the yoke deflection signal reverses direction, as in FIG. 3a at slope 55 of the raster signal, switch 30 is opened and switch 28 is closed. The corresponding waveforms applied to driver 12 are shown in FIGS. 5c and 5d, with the resultant driver output voltage, FIG. 5b. This occurs at point 65 where the yoke current reverses in slope, thus triggering switch control 36 to close switch 28 and open switch 30 in accordance with FIG. 3c. At point 66, while the slope is positive, the current remains negative and therefore continues flowing upward, diminishing in amplitude through yoke L. $+68$ V is applied through switch 28 to node 22 and terminal 58 of driver 12. The negative −22 V potential from −V$_S$ at the anode and +68 V at the cathode results in back biasing diode 32. FIG. 5b shows that a positive potential of approximately 50–60 V is applied to yoke L by yoke driver 12. Since the current through yoke L is in a negative direction, it must flow through line 15 to driver 12 and out terminal 60 in node 26. Since switches 24 and 30 are turned off, the current path continues through diode 34 to power supply +V$_S$. Diode 34 is forward biased by +60 V at the anode and +22 V at the cathode.

The current cycle is completed at segment 68 of FIG. 5a. Here the yoke current has again reversed direction and is now positive, while switch 28 remains on and switch 30 remains off. Since the current is flowing in a positive direction it must flow through the upper section of driver 12. Diode 32 remains back biased and therefore no current flows therethrough. Further, since switches 24 and 30 are off, and no current may flow in a positive direction through the lower section of driver 12, no current flows through diode 34. The current path is therefore seen to be from supply +V$_R$ through switch 28 to node 22. It then follows the path to terminal 58 of driver 12 and through line 15 to yoke L and resistor R to ground.

It may seen from the Figures that to achieve the required driver output voltage, power supplies +V$_R$ and +V$_S$ are applied to nodes 22 and 26, respectively, during the positive slope yoke current and that power supplies −V$_S$ and −V$_R$ are applied during the negative slope of yoke current. Thus, to achieve the desired driver voltage, supply +V$_R$ must be greater in magnitude in a positive polarity sense than supply +V$_S$, and supply −V$_R$ must be greater in magnitude in a negative polarity sense than supply −V$_S$. Note that the driver voltage departs from a rectangular waveform. The slope of the required driver output voltage as shown in FIG. 5b is required to linearize the driver current in view of the voltage loss in feedback resistor R and the internal resistance of yoke L with increasing or decreasing yoke current.

Figure 5E:
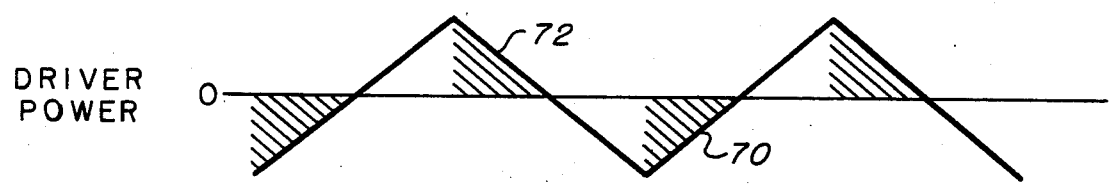

It may also be seen that in the raster mode during portions of each cycle of yoke current the energy stored in the yoke L is returned to the −V$_S$ or +V$_S$ power supplies. This occurs from the time switch S30 is turned off until the yoke current changes from minus to plus as in shaded segment 70 of FIG. 5 e, and when switch S28 is turned off at point 61 of FIG. 5a until the current changes from plus to minus, as in segment 72 of FIG. 5 e. The shaded segments of FIG. 5e represent energy returned to the power supplies. Assuming values of ±68 V and ±22 V for the power supplies, and a peak yoke current of 3 amp, a conventional beam deflection system without raster voltage switching would consume 102 watts, while the present invention consumes only 34.5 watts, assuming no losses due to circuit components or switching time.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An electron beam magnetic deflection system for a cathode ray tube controllably operable to provide linear deflection in a stroke mode for random deflection of the beam and a raster mode for periodic deflection of the beam in a sequential pattern of raster lines, comprising:
   input means for receiving an input signal indicative of a desired deflection of the beam and for providing an output signal responsive to said input signal,
   output means coupled to receive said output signal for providing a further output signal for controlling current in a deflection coil operatively coupled to said electron beam, and a desired beam deflection in a predetermined direction in accordance with the polarity of said further output signal,
   first and second raster mode switches and first and second stroke mode switches,
   means for applying stroke voltage sources of a predetermined magnitude and of a first polarity and an opposing polarity to said first and second stroke mode switches respectively in said stroke mode,
   means for applying raster voltage sources of a further predetermined magnitude greater than said predetermined magnitude and of a first polarity and an opposing polarity respectively to said first and second raster mode switches in said raster mode,
   switch control means responsive to a raster/stroke signal for sequentially commanding said stroke mode or said raster mode of operation and further responsive to said further output signal from said output means for alternately enabling and disabling said first and second raster mode switches in said raster operating mode when generating said raster lines in accordance with the polarity of said further output signal, and for enabling said first and second stroke mode switches in said stroke mode, and
   first coupling means for coupling said output means to one of said stroke voltage sources, when one of said first and second raster mode switches is disabled in said raster mode of operation when generating said raster lines.

2. The system as set forth in claim 1, wherein said switch control means comprises logic gate means for sequentially and alternately energizing said first and second stroke mode switches in said stroke mode and said first and second raster mode switches in said raster mode, and said switch control means is further responsive to said further output signal from said output means indicative of a predetermined direction of beam deflection, said first and second raster mode switches and said first and second stroke mode switches coupled to provide raster voltages of magnitudes greater than voltages of corresponding polarities when energized in said stroke mode.

3. The system of claim 2, wherein said raster mode is operable in a unidirectional flyback mode.

4. The system of claim 3, wherein said raster mode is operable in a bidirectional scan mode.

5. The system of claim 3, wherein at least one of said first and second raster mode switches is coupled to a source of positive voltage polarity.

6. The system of claim 5, wherein at least one other than said one of said first and second raster mode switches is coupled to a source of negative voltage polarity.

7. The system of claim 6, wherein: said first raster mode switch comprises first and second terminals, said first terminal coupled to receive said raster voltage source of positive polarity, said second terminal coupled to energize said output means and to deflect said electron beam in a first predetermined direction when said first raster mode switch is activated by said switch control means in said raster mode, said first stroke mode switch comprises first and second terminals, said first terminal of said first stroke mode switch coupled to receive said stroke voltage source of positive polarity, said second terminal of said first stroke mode switch coupled to said second terminal of said first master mode switch, said first stroke mode switch responsive to said switch control means to energize said output means in said stroke mode, a second raster mode switch having first and second terminals, said first terminal thereof coupled to receive said raster voltage source of negative polarity, said second terminal thereof coupled to energize said output means and deflect said electron beam in a second predetermined direction when said second raster mode switch is activated by said switch control means in said raster mode, a second stroke mode swtich having first and second terminals, said first terminal thereof coupled to receive said stroke voltage source of negative polarity, said second terminal of said second stroke mode switch coupled to said second terminal of said second raster mode switch, said second stroke mode switch responsive to said switch control means to energize said output means in said stroke mode, first unidirectional conducting means having a cathode terminal coupled to said second terminals of said first raster mode and first stroke mode switches and an anode terminal coupled to said voltage source of negative polarity and said first terminal of said second stroke mode switch, for coupling said output means to said source of stroke voltage of opposing polarity when said first switch means is de-energized by said switch control means, and second unidirectional conducting means having an anode terminal coupled to said second terminal of said second raster mode and second stroke mode switches and a cathode terminal coupled to said voltage source of positive polarity and to said second terminal of said first switch, for coupling said output means to said source of stroke voltage of a first polarity when said third switch means is de-energized by said switch control means, said first and second raster mode switches being alternately energized when in said raster mode, said first and second stroke mode switches being simultaneously energized in said stroke mode.

8. The system of claim 1, further comprising second coupling means for coupling said output means to one other than said one of said stroke voltage sources when one other said one of said first and second raster mode switches is disabled in said raster mode of operation when generating said raster lines.

9. The system of claim 2 wherein said first and second coupling means comprise first and second diodes, respectively, coupling said output means to ones of said stroke voltage sources.

* * * * *